United States Patent
Schneider

(10) Patent No.: US 12,052,849 B2
(45) Date of Patent: Jul. 30, 2024

(54) HEAT ENGINE

(71) Applicant: ebm-papst Mulfingen GmbH & Co. KG, Mulfingen (DE)

(72) Inventor: Alex Schneider, Kuenzelsau (DE)

(73) Assignee: ebm-papst Mulfingen GmbH & Co. KG, Mulfingen (DE)

( * ) Notice: Subject to any disclaimer, the term of this patent is extended or adjusted under 35 U.S.C. 154(b) by 37 days.

(21) Appl. No.: 17/342,600

(22) Filed: Jun. 9, 2021

(65) Prior Publication Data

US 2021/0392794 A1    Dec. 16, 2021

(30) Foreign Application Priority Data

Jun. 10, 2020    (DE) .................... 10 2020 115 492.5

(51) Int. Cl.
*H05K 7/20*    (2006.01)

(52) U.S. Cl.
CPC ......... *H05K 7/20936* (2013.01); *H05K 7/209* (2013.01)

(58) Field of Classification Search
CPC .............. H05K 7/20; H05K 7/2029; H05K 7/20309–20327; H05K 7/20663; H05K 7/20681; H05K 7/20709; H05K 7/20818; H05K 7/20827; H05K 7/20881; H05K 7/209; H05K 7/20936; H01L 23/427; H01L 23/473; H01L 23/34; F25B 1/00; F25D 15/02; F25D 15/0266; F25D 15/0275

See application file for complete search history.

(56) References Cited

U.S. PATENT DOCUMENTS

| | | | |
|---|---|---|---|
| 3,421,339 A | | 1/1969 | Volk et al. |
| 4,242,878 A | * | 1/1981 | Brinkerhoff ........ F04B 39/0005 165/47 |
| 4,720,981 A | * | 1/1988 | Helt .................... H05K 7/20936 165/80.4 |
| 2003/0019234 A1 | * | 1/2003 | Wayburn .............. H01L 23/427 257/E23.088 |

(Continued)

FOREIGN PATENT DOCUMENTS

| | | |
|---|---|---|
| AT | 12869 U1 | 1/2013 |
| CN | 111247879 A | 6/2020 |

(Continued)

OTHER PUBLICATIONS

EP3217116A1 English Translation (Year: 2017).*

(Continued)

*Primary Examiner* — Amir A Jalali
(74) *Attorney, Agent, or Firm* — Harness, Dickey & Pierce, P.L.C.

(57) ABSTRACT

A heat engine (10), particularly a heat pump, has a first heat exchanger (11), a compressor (12), a second heat exchanger (13), and a throttle device (14) connected by a refrigerant line (15), through which a refrigerant flows, and electronics (21, 22, 23) with power electronics for supplying power to and/or control electronics for controlling the heat engine (10). A heat transfer mechanism (24) absorb at least thermal energy emitted by the electronics (21, 22, 23) and transfer it to the refrigerant and/or, insofar as one exists, to a system medium flowing through the first or second heat exchanger.

14 Claims, 3 Drawing Sheets

(56) References Cited

U.S. PATENT DOCUMENTS

| | | | | |
|---|---|---|---|---|
| 2003/0019235 | A1* | 1/2003 | Wall | F25B 49/027 |
| | | | | 257/E23.088 |
| 2003/0102108 | A1* | 6/2003 | Sarraf | F28D 15/0266 |
| | | | | 165/104.33 |
| 2007/0187069 | A1* | 8/2007 | Ueno | H01L 23/427 |
| | | | | 165/104.33 |
| 2009/0092501 | A1* | 4/2009 | Seibel | F04B 35/04 |
| | | | | 700/275 |
| 2009/0126910 | A1* | 5/2009 | Campbell | H05K 7/20781 |
| | | | | 165/104.33 |
| 2009/0301109 | A1* | 12/2009 | Manole | F25B 9/008 |
| | | | | 62/175 |
| 2010/0114384 | A1* | 5/2010 | Maxwell | F24H 9/142 |
| | | | | 700/276 |
| 2010/0132402 | A1* | 6/2010 | Lifson | F25B 40/00 |
| | | | | 62/515 |
| 2010/0328888 | A1* | 12/2010 | Campbell | H01L 23/4735 |
| | | | | 361/699 |
| 2012/0255319 | A1 | 10/2012 | Itoh et al. | |
| 2015/0184949 | A1* | 7/2015 | So | H01L 23/427 |
| | | | | 165/104.25 |
| 2015/0377537 | A1* | 12/2015 | West | F25B 49/022 |
| | | | | 62/115 |
| 2020/0154603 | A1* | 5/2020 | Mizutani | H05K 7/20309 |
| 2022/0210949 | A1* | 6/2022 | Edmunds | H05K 7/20272 |

FOREIGN PATENT DOCUMENTS

| | | | |
|---|---|---|---|
| DE | 10327953 | A1 | 1/2004 |
| DE | 102013225450 | B3 | 3/2015 |
| DE | 112014001071 | T5 | 11/2015 |
| DE | 112017007720 | T5 | 3/2020 |
| EP | 3217116 | A1 * | 9/2017 |
| EP | 3301379 | A1 | 4/2018 |
| EP | 3450879 | A1 | 3/2019 |
| JP | 2012-127591 | A | 7/2012 |
| JP | 2014-102050 | A | 6/2014 |
| JP | 2014102050 | A * | 6/2014 |
| JP | 2016-121843 | A | 7/2016 |
| WO | WO-2010034569 | A1 | 4/2010 |

OTHER PUBLICATIONS

JP2014102050A English Translation (Year: 2014).*
German Search Report dated Oct. 23, 2020 in corresponding German Application No. 10 2020 115 492.5.
Chinese Office Action And Search Reported dated Sep. 26, 2023 in corresponding Chinese Application No. 202110599506.9.

* cited by examiner

HEAT ENGINE

CROSS-REFERENCE TO RELATED APPLICATION

This application claims priority to German Patent Application No. 10 2020 115 492.5 filed Jun. 10, 2020. The entire disclosure of the above application is incorporated herein by reference.

FIELD

The disclosure relates to a heat engine, particularly to a heat pump, with a heat-transfer mechanism for enhancing efficiency.

BACKGROUND

Heat engines such as heat pumps and refrigerating machines, for example, have long since been known in the prior art. These generate thermal energy using mechanical energy and a thermodynamic process. A heat pump extracts thermal energy from an original or source system and feeds it to a target system. In the case of a refrigerator, it is essentially merely a matter of interchanging the source and target system. Thus, heat is extracted from the target system and fed to the source system.

However, there is usually a loss of heat during the generation of mechanical energy, which leads to a reduction in the efficiency of the overall system.

For example, electronic assemblies or components of the heat engine heat up, which not only leads to heat losses but often to overheating of the assemblies or components and thus to a reduction in the service life of these components.

SUMMARY

It is therefore the object of the disclosure to overcome the aforementioned disadvantages and provide a heat engine whose efficiency and service life are enhanced compared to a conventional heat engine.

The object is achieved by a heat engine, particularly a heat pump, with a first heat exchanger, a compressor, a second heat exchanger, and a throttle device connected by a refrigerant line, through which a refrigerant flows. Electronics are included, such as power electronics, to supply power to, and/or control electronics, to control the heat engine. A heat-transfer mechanism is designed to absorb at least thermal energy emitted by the electronics and to transfer it to the refrigerant.

According to the disclosure, proposed is a heat engine, particularly as a heat pump, but can in principle also be embodied as a refrigerator. The heat engine has a first heat exchanger, particularly an evaporator, a compressor, a second heat exchanger, particularly a condenser, and a throttle device. These components are connected by a refrigerant line through which a refrigerant flows.

Another aspect of the disclosure relates to a further heat engine in the form of a heat pump that can also be embodied as a refrigerator. In the further heat engine, a provision is additionally made that its first heat exchanger and/or its second heat exchanger are each designed to allow the refrigerant to flow along a first flow path and a system medium or system fluid to flow through it along a second separate flow path. Thus, heat can be transferred between the refrigerant and the system medium. Such a system medium or system fluid can be water or a water-glycol mixture, for example. A system medium flowing through the first or second heat exchanger can also be referred to as a secondary medium or secondary fluid that flows through the second flow path in the first or second heat exchanger and hence through a circuit that is secondary to the refrigerant line.

In a variant where the second heat exchanger is a liquefier, a provision is made that the refrigerant condenses in the liquefier. Thus, the liquefier in this variant can also be referred to as a condenser.

For heat engines that are inherently known in the prior art and embodied as heat pumps, the refrigerant, which is propane gas or another suitable refrigerant, for example, is compressed in the motor-driven compactor or a compressor and is heated in the process. In the second heat exchanger, which can be embodied as a liquefier or condenser or can include one, the hot, compressed refrigerant can then give off its heat to a target system, such as a heater. In the process, the compressed refrigerant cools down and condenses. During the subsequent passage through the throttle device, which is usually an extreme constriction in the refrigerant line that is formed by a pipe, the liquid refrigerant is decompressed, evaporates, and becomes very cold. The cold refrigerant is allowed to flow through the first heat exchanger, which is embodied as an evaporator, for example, or include one. The first heat exchanger, more particularly the refrigerant flowing through same, is heated from the outside or by a source system, for example by groundwater or the outside air, thereby heating the refrigerant again. In this way, the refrigerant from the source system—e.g., the groundwater or the outside air—absorbs just as much heat as it had previously emitted to the target system, e.g., for heating. It is then fed back into the compressor, and the process begins anew.

According to the disclosure, the heat engine further comprises electronics, particularly with or without an associated circuit board, and power electronics for supplying power to and/or control electronics for controlling and commutating the heat engine and/or components. A provision is preferably made that the power electronics supply at least part and preferably all of the electronic components of the heat engine with electric power, and convert it appropriately. The control electronics commutate and preferably regulate at least part and preferably all of the components of the heat engine and, in particular, the compressor and/or components. According to the disclosure, a provision is additionally made where the heat engine also has a heat-transfer mechanism that is designed to absorb at least a thermal energy emitted by the electronics and to transfer it to the refrigerant or—insofar as one exists—to another system medium that is present in the heat engine.

The electronics, the power electronics and/or the control electronics, emit thermal energy as waste heat. The basic idea of the disclosure is to collect the heat through targeted action of these heat sources on the heat-transfer mechanism and to transfer it in a concentrated manner to the refrigerant and/or, insofar as one exist, a system medium. Thus, heat that is otherwise lost is purposefully conveyed to the thermodynamic process and used and, at the same time, the electronics are cooled and their service life is increased as a result.

If one considers heat pump systems that are customary on the market, for example, their efficiency just in terms of their electronics is approximately 94%. Accordingly, the heat engine according to the disclosure has a clearly positive effect starting at an electrical output in the kW range. If such a system has an electrical output of 3.5 kW, for example, approximately 210 W of this is lost in the form of heat as power loss. In the heat engine according to the disclosure, this power loss is collected by the heat-transfer mechanism and concentrated in the refrigerant and/or, insofar as one exists, fed back into the system medium, into the thermodynamic process.

In larger systems, for example with an electrical output of 12 kW, there is already a power loss of approximately 720 W, which is not lost with the heat engine according to the disclosure, but rather is returned to or fed back into the thermodynamic process.

By virtue of the proposed heat engine according to the disclosure, the performance factor, which is referred to as the coefficient of performance (COP) or energy efficiency ratio (EER), depending on the context, can be enhanced both in a variant embodied as a refrigerator and as a heat pump. The additional heat input also leads to an increase in efficiency due to the improvement in the annual coefficient of performance.

In addition to enhancing work efficiency, individual electronic components can also be made smaller due to the improved cooling, resulting in cost savings. In addition, the cooling by the heat-transfer mechanism also increases the service life of the electronic components and the electronics.

The electronics or components, whose waste heat is absorbed by the heat-transfer mechanism and transferred to the refrigerant and/or, insofar as one exists, to the system medium, can be individually active and passive electronic components, such as chokes, capacitors, power modules, MOSFETs, IGBTs, diodes, etc. In addition to the individual components, the heat or waste heat from electronic assemblies of the electronics, such as from commutation electronics of an electric motor, a motor control, or a frequency converter, can also be absorbed by the heat-transfer mechanism and transferred to the refrigerant and/or, insofar as one exists, to the system medium.

In order to achieve an advantageous transfer of the heat or waste heat from the electronics to the heat-transfer mechanism, in an advantageous development, the heat-transfer mechanism is a heat sink made of aluminum. The heat sink rests directly against the electronics or components as well as the refrigerant line or forms portions of the refrigerant line. Furthermore, the heat sink is designed to transfer the absorbed thermal energy to the refrigerant in the refrigerant line. Alternatively, the heat-transfer mechanism includes a plurality of heat sinks. It is also possible that the heat-transfer mechanism does not rest against the refrigerant line, but rather forms at least portions of it. In one variant of the heat engine, where it has a system medium and a line carrying the system medium, a provision can be additionally or alternatively made where the heat sink also rests directly against the line carrying the system medium and defining the second flow path or forms portions of the line. The heat sink is designed to transfer the absorbed thermal energy to the system medium.

In a further advantageous embodiment, the heat-transfer mechanism rests against a section of the refrigerant line running from the first heat exchanger, which can be embodied as an evaporator, to the compressor, against the so-called suction line, or forms at least a portion of this section. If the heat-transfer mechanism is positioned in the direction of flow of the refrigerant in such a way that the heat input through the heat-transfer mechanism to the refrigerant or the heat transfer to the refrigerant takes place after the first heat exchanger and before the compressor, the refrigerant, which is sucked in through the compressor after exiting the first heat exchanger, receives an additional heat input through the heat-transfer mechanism. Thus, the refrigerant is re-evaporated after the first heat exchanger. As a result, refrigerant that is possibly still in liquid form is evaporated and the compressor is protected from such refrigerant that is still in liquid form, since the compression of liquid refrigerant in the compressor can damage the compressor. An attempt to compress such a liquid can result in the destruction or self-destruction of the compressor.

Through such positioning of the heat-transfer mechanism and the associated re-evaporation, the refrigeration circuit and the heat pump can be operated, for example, with a slight overheating of nearly 0 Kelvin in the refrigeration circuit or in the refrigerant. Thus, the system is raised to a higher level of efficiency.

In order to achieve an efficient transfer of the heat from the electronics to the refrigerant by way of the heat-transfer mechanism, preferably a heat sink, a provision is also preferably made that the heat engine further comprises a heat-transfer unit where the electronics and the heat-transfer mechanism are integrated. The electronics and the heat-transfer mechanism are preferably embodied accordingly as one assembly, it being possible for them to be encapsulated by a common housing, for example.

Accordingly, particularly in a variant where the heat-transfer mechanism is between the first heat exchanger, which is preferably an evaporator, and the compressor, the heat-transfer unit is preferably arranged along the refrigerant line between the first heat exchanger and the compressor. The refrigerant line can also run through the heat-transfer unit.

As already stated above, a provision is preferably made that the electronics have heat-emitting electrical components or electrical components or assemblies. To improve the heat transfer from these components, in one advantageous variant the electronics and/or electrical components are at least partially enclosed by the heat-transfer mechanism. Moreover, in one advantageous development, at least portions of the electronics or electrical components can be embedded in the heat-transfer mechanism. Accordingly, the heat-transfer mechanism can be designed to encompass the electronics or at least a portion of the assemblies or components of the electronics on multiple sides.

The electrical components whose residual heat or waste heat is transferred to the refrigerant by way of the heat-transfer mechanism can be both active and passive electrical components and also assemblies of such electrical components.

In an advantageous development, the respective electronics or the assemblies that form the respective electronics can also be specifically adapted to the heat-transfer mechanism. For example, a provision can be made that commutation electronics of an electric motor of the compressor or the electronics in general are constructed in such a way that essentially all power semiconductors and passive electrical components, such as a PFG choke, are positioned directly adjacent to one another so that they adjoin or rest against the heat-transfer mechanism in a locally limited area.

Accordingly, the power components for link processing and the components of commutation electronics of the compressor motor are preferably positioned on the heat-transfer mechanism. It is also possible for additional components of other assemblies or other electronics to adjoin the heat-transfer mechanism.

Since there should be no losses at the heat-transfer mechanism during the transport or transfer of heat from the electronics to the refrigerant, it can also be insulated so that no heat or as little heat as possible is emitted to the outside.

Accordingly, it is also advantageous to provide the heat-transfer mechanism in a locally limited area.

In order to enable the heat to be transferred from the electronics to the refrigerant, a provision is made in one embodiment, which is also advantageous, where the heat-transfer mechanism has at least one circumferentially closed recess. The at least one circumferentially closed recess can be flowed through by the refrigerant and forms a section of the refrigerant line or is designed to receive a section of the refrigerant line. If the circumferentially closed recess receives the refrigerant line, a further provision is preferably provided that any existing thermal insulation of the refrigerant line in the area of the heat-transfer mechanism is removed so as not to hinder the heat input into the refrigerant. In one simple design variant, the circumferentially closed recess can be embodied as a bore or as a passage with a round or square cross section that defines a channel for the refrigerant through the heat-transfer mechanism. If a line carrying a system medium is present, a provision can be made that the circumferentially closed recess can be flowed through by the system medium and forms a section of the line or is designed to accommodate a section of the line carrying the system medium. Accordingly, the additional features relating to the circumferentially closed recess can be transferred from the refrigerant line to the line carrying a system medium.

Alternatively, but also in addition to a circumferentially closed recess, the heat-transfer mechanism can have at least one circumferentially open recess, in a further development. The at least one circumferentially open recess is designed to encompass the refrigerant line in sections. Accordingly, the at least one circumferentially open recess can be embodied as an indentation in the heat-transfer mechanism or as a protrusion in the heat-transfer mechanism. Thus, a pipe forming the refrigerant line, for example, can be inserted into the recess. Any existing thermal insulation of the refrigerant line is preferably removed at least on that portion of the refrigerant line that rests against the heat-transfer mechanism. Thus, the introduction of heat into the refrigerant via the refrigerant line is not hindered. If there is a line carrying a system medium, a provision can accordingly be made for the circumferentially open recess to be designed to encompass the line in sections. Accordingly, the additional features relating to the circumferentially open recess can also be transferred from the refrigerant line to the line carrying a system medium.

In order to increase the distance along which the refrigerant flows through the heat-transfer mechanism, so that a correspondingly greater amount of heat input into the refrigerant can take place, the refrigerant line or, in an alternative embodiment, the line carrying a system medium extends in a meandering manner along and/or through the heat-transfer mechanism or is formed in a meandering shape in the region of the heat-transfer mechanism. Here, "meandering" is understood to mean a course of the respective line that has a plurality of bends.

If the refrigerant line or, in an alternative embodiment, the line carrying a system medium is formed outside or by the heat-transfer mechanism, for example by a pipe or hose system, a fastening device is provided on the heat-transfer mechanism to fix the refrigerant line or the respective line so that it can be secured in place on the heat-transfer mechanism. This fastening device is embodied as a flange, for example, and/or it can have a quick-release fastener or quick-connect technology. Thus, a pipe or pipe system can be fixed on or in the heat-transfer mechanism, for example.

To further increase the efficiency of the heat engine, a further embodiment, it also has an additional heat exchanger that rests against the compressor or a heat-emitting component of the compressor, such as a compressor motor, or is integrally formed with the compressor or a housing of the compressor. Furthermore, the (additional) heat exchanger rests against the refrigerant line or, insofar as one exists, the line carrying the system medium, or forms sections thereof. The (additional) heat exchanger is also designed to absorb at least a thermal energy emitted by the compressor and to transfer it to the refrigerant or the system medium, that is, to transfer it from the compressor to the refrigerant or the system medium. During operation, the housing of a compressor can be heated to over 50° C., for example. This heat can be transferred to the refrigerant or the system medium through suitable thermal coupling by mechanism of the additional heat exchanger.

The additional heat exchanger can be formed, for example, by a copper spiral around the compressor, aluminum plates, or the like.

Here, too, a provision is preferably made that the additional heat exchanger rests against the refrigerant line in the direction of flow upstream from the compressor. Thus, the refrigerant is re-evaporated before it enters the compressor.

The features disclosed above can be combined as required, provided this is technically possible and they do not contradict one another.

Further areas of applicability will become apparent from the description provided herein. The description and specific examples in this summary are intended for purposes of illustration only and are not intended to limit the scope of the present disclosure.

DRAWINGS

Other advantageous developments of the disclosure are in the subclaims and/or depicted in greater detail below together with the description of the preferred embodiment of the disclosure with reference to the figures. In the drawing:

DETAILED DESCRIPTION

Figure 1:
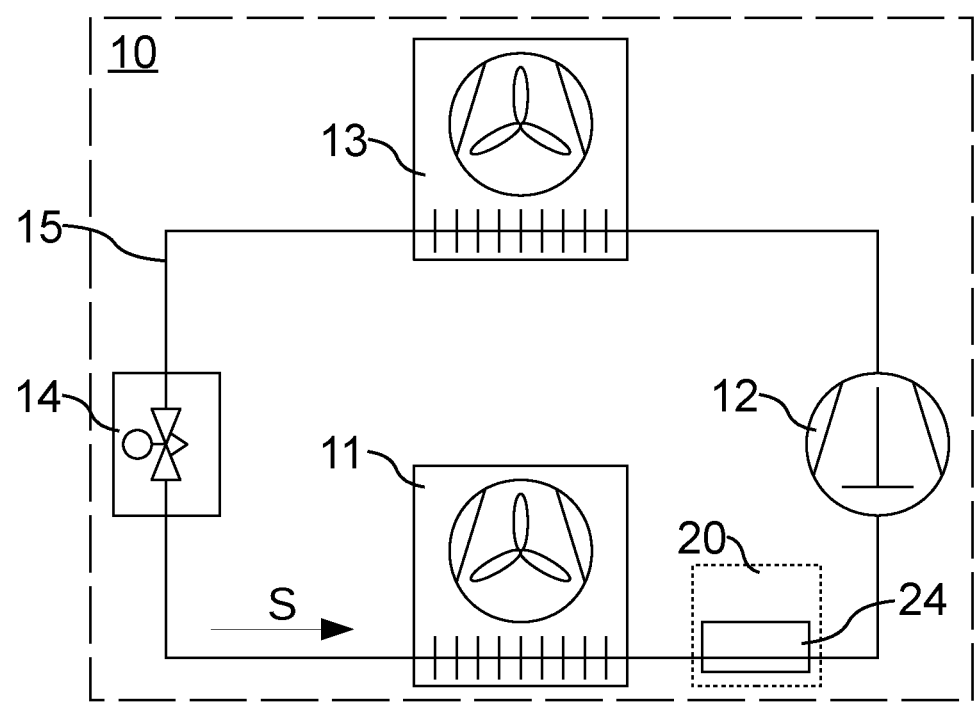
FIG. 1 is a schematic view of a heat engine.

The figures are schematic examples. The same reference symbols in the figures indicate same functional and/or structural features. FIG. 1 shows a schematic example of the components and the operative connection of the components of a heat engine 10, more particularly the heat pump 10. In the heat engine 10, the evaporator is the first heat exchanger 11, a compactor or compressor 12 (e.g., a liquefier or condenser) is the second heat exchanger 13, and a throttle device 14 are interconnected by a refrigerant line 15, through which a refrigerant flows along the direction of flow S. The first heat exchanger 11 and the second heat exchanger 13 are also shown by way of example as purely air-loaded lamellar heat exchangers. The known thermodynamic process takes place in the heat engine 10. To control the heat engine 10, it also includes electronics 21, 22, 23, which, however, are not shown in FIG. 1. They can be part of the components of the heat engine 10 shown in FIG. 1, for example, or integrated into a heat-transfer unit 20. The electronics are preferably passive and active electronic components such as chokes, capacitors, modules, MOSFETs, IGBTs, etc.

Furthermore, the heat engine 10 include a heat-transfer mechanism 24, which, preferably, and as shown in FIG. 1, is integrated into the heat-transfer unit 20. The heat-transfer mechanism 24 or the heat-transfer unit 20 is preferably arranged along the direction of flow S of the refrigerant between the first heat exchanger 11 and the compressor 12. Thus, components of the refrigerant that are possibly still liquid and were not or were not completely evaporated in the second heat exchanger 11 are re-evaporated. Accordingly, no liquid components of the refrigerant can get into the compressor 12, whereby it is protected against damage.

Figure 2:
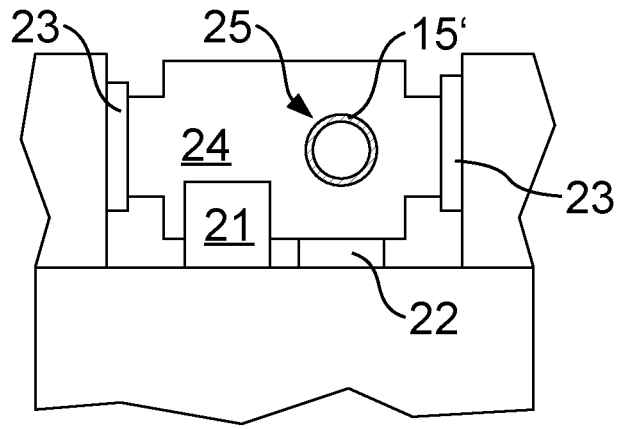
FIG. 2 is a partial cross-sectional schematic view of a first variant of a heat-transfer mechanism.
Figure 3:
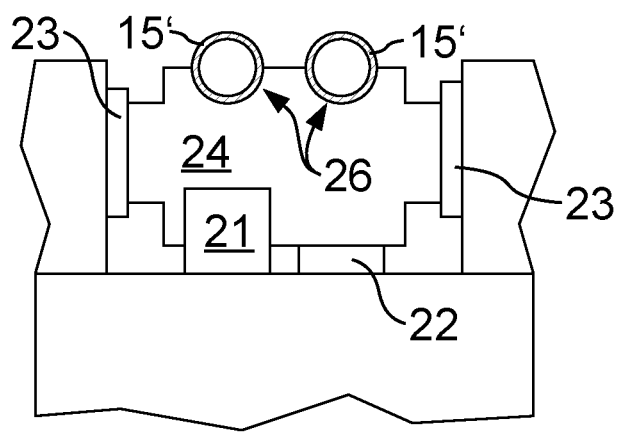
FIG. 3 is a partial cross-sectional schematic view of second variant of a heat-transfer mechanism.

FIGS. 2 and 3 each show a variant of a heat-transfer mechanism 24 with surrounding electronics 21, 22, 23 or surrounding electronic components. It is possible for the electronics 21, 22, 23 to each be integrated together into a heat-transfer unit 20. The heat transfer mechanism can be a heat sink made of aluminum or the like.

First electronics 21 with or without an associated printed circuit board are provided and can have a passive electrical component, a PFG choke, an intermediate circuit choke, a buck converter, or a plurality of such components. Furthermore, a power output stage of a main commutation or compressor commutation with or without an associated circuit board is provided with the second electronics 22. In addition, the third electronics 23, with or without an associated circuit board, can be provided with one or more additional heat sources, such as additional power output stages for fan commutation of fans belonging to the heat engine, for example. The third electronics 23 or components can also be plugged in according to the plug-in principle and brought into contact with the heat-transfer mechanism 24.

The variants according to FIGS. 2 and 3 differ essentially in that, in the embodiment according to FIG. 1, a circumferentially closed recess 25 is provided and is designed to receive or form a pipe 15' or pipe system forming the refrigerant line 15 or, alternatively, a line carrying the system medium.

In a departure therefrom, two circumferentially open recesses 26 are provided in the variant according to FIG. 3. Although it is also possible for only one circumferentially open recess 26 to be provided. The circumferentially open recesses 26 are each designed to encompass, at least in sections, the pipe 15' forming the refrigerant line 15 or the line carrying the system medium.

In both the variant according to FIG. 2 and FIG. 3, a provision is made that the heat-transfer mechanism 24 absorbs the heat from the electrical system 21, 22, 23 and transfers it to the refrigerant or to the system medium flowing through the pipe 15' and/or the heat-transfer mechanism 24.

In an alternative embodiment (see FIG. 4), the line 31 carrying a system medium extends in a meandering manner along and/or through the heat-transfer mechanism 24 or is formed in a meandering shape in the region of the heat-transfer mechanism 24. Here, "meandering" is understood to mean a course of the respective line that has a plurality of bends.

In an alternative embodiment (see FIG. 4), the line carrying a system medium is formed outside or by the heat-transfer mechanism 24. A fastening device 32 is provided on the heat-transfer mechanism 24 to fix the refrigerant line or the respective line so that it can be secured in place on the heat-transfer mechanism 24. This fastening device 32 is embodied as a flange, for example, and/or it can have a quick-release fastener or quick-connect technology, so that a pipe or pipe system can be fixed on or in the heat-transfer mechanism 24.

Figure 4:
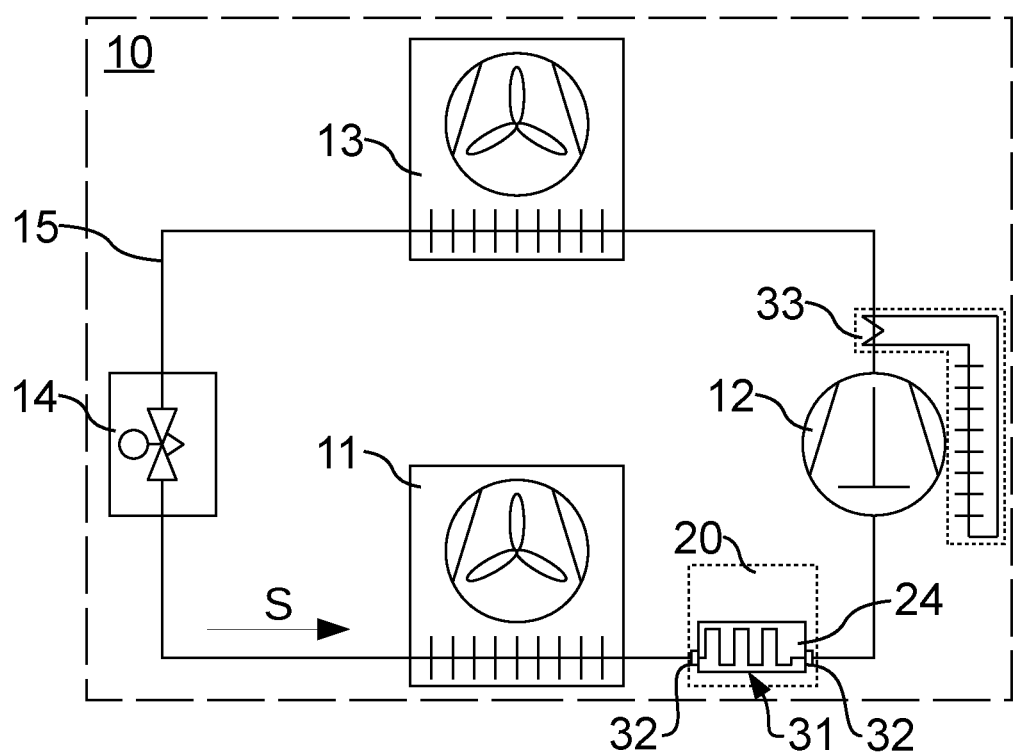
FIG. 4 is a schematic representation of an additional heat engine.

Also, in FIG. 4, a further embodiment of an additional heater exchanger 33 is shown. The heat exchanger 33 rests against the compressor 12 or a heat-emitting component of the compressor, such as a compressor motor, or is integrally formed with the compressor or a housing of the compressor. Furthermore, the (additional) heat exchanger 33 rests against the refrigerant line or—insofar as one exists—the line carrying the system medium, or forms sections thereof. The (additional) heat exchanger 33 is also designed to absorb at least a thermal energy emitted by the compressor and to transfer it to the refrigerant or the system medium—that is, to transfer it from the compressor to the refrigerant or the system medium. During operation, the housing of a compressor can be heated to over 50° C., for example. This heat can be transferred to the refrigerant or the system medium through suitable thermal coupling by means of the additional heat exchanger 33. The additional heat exchanger 33 can be formed, for example, by a copper spiral around the compressor, aluminum plates, or the like.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A heat engine, particularly a heat pump, comprising:
a first heat exchanger, a compressor, a second heat exchanger, and a throttle device connected by a refrigerant line through which a refrigerant flows continuously through the first heat exchanger, the compressor, the second heat exchanger and the throttle device;
electronics that include power electronics for supplying power to and/or control electronics for controlling the heat engine, and
a heat-transfer mechanism, positioned on the refrigerant line downstream of the first heat exchanger and upstream of the compressor wherein the heat transfer mechanism is between the first heat exchanger and the compressor without any other components there between, designed to absorb at least thermal energy emitted by the electronics and to transfer it to the refrigerant, wherein the electronics have heat emitting electrical components, the heat emitting electrical components are arranged immediately adjacent to one another and surround and rest on the heat transfer device in a locally limited area, so that the thermal energy is transferred to the refrigerant in a concentrated manner.

2. The heat engine as set forth in claim 1, wherein the heat-transfer mechanism is a heat sink that rests directly against the electronics or the heat-emitting electrical components of the electronics and against the refrigerant line or forms the refrigerant line in sections, the heat sink transfers the absorbed thermal energy to the refrigerant in the refrigerant line.

3. The heat engine as set forth in claim 1, wherein the heat-transfer mechanism rests against a section of the refrigerant line running from the first heat exchanger to the compressor or forms at least a portion of this section.

4. The heat engine as set forth in claim 1, further comprising a heat-transfer unit into which the electronics and the heat-transfer mechanism are integrated.

5. The heat engine as set forth in claim 4, wherein the heat-transfer unit is arranged along the refrigerant line between the first heat exchanger and the compressor.

6. The heat engine as set forth in claim 1, wherein the electronics have the heat-emitting electrical components and the electronics and/or electrical components are enclosed by the heat-transfer mechanism at least in sections.

7. The heat engine as set forth in claim 6, wherein the electrical components are active and/or passive electrical components.

8. The heat engine as set forth in claim 1, wherein the heat-transfer mechanism has at least one circumferentially closed recess and the refrigerant can flow through the at least one circumferentially closed recess and forms a section of the refrigerant line or receives a section of the refrigerant line.

9. The heat engine as set forth in claim 1, wherein the heat-transfer mechanism has at least one circumferentially open recess and the at least one circumferentially open recess is designed to encompass the refrigerant line in sections.

10. The heat engine as set forth in claim 1, wherein the refrigerant line extends in a meandering shape along and/or through the heat-transfer mechanism or is formed in sections by same.

11. The heat engine as set forth in claim 1, wherein a fastening device for fixing the refrigerant line is provided on the heat-transfer mechanism.

12. The heat engine as set forth in claim 1, further comprising a heat exchanger that rests against the compressor or is integrally formed therewith, rests against the refrigerant line or forms same in sections and the heat exchanger absorbs at least thermal energy emitted by the compressor and to transfer it to the refrigerant in the refrigerant line.

13. A heat engine, particularly a heat pump, comprising a first heat exchanger, a compressor, a second heat exchanger, and a throttle device connected by a refrigerant line through which a refrigerant flows continuously through the first heat exchanger, the compressor, the second heat exchanger and the throttle device;
    electronics that include power electronics for supplying power to and/or control electronics for controlling the heat engine;
    the first heat exchanger and/or the second heat exchanger are each designed to allow the refrigerant to flow along a first flow path and a system medium to flow through it along a second separate flow path so that heat can be transferred between the refrigerant and the system medium; and
    a heat-transfer mechanism, positioned on the refrigerant line downstream of the first heat exchanger and upstream of the compressor wherein the heat transfer mechanism is between the first heat exchanger and the compressor without any other components there between, to absorb at least thermal energy emitted by the electronics and to transfer it to the refrigerant and/or to the system medium, wherein the electronics have heat emitting electrical components, the heat emitting electrical components are arranged immediately adjacent to one another and surround and rest on the heat transfer device in a locally limited area, so that the thermal energy is transferred to the refrigerant in a concentrated manner.

14. The heat engine as set forth in claim 13, wherein the heat-transfer mechanism is a heat sink that rests directly against the electronics or directly against the heat-emitting electrical components of the electronics, and the heat sink also rests against the refrigerant line or forms the refrigerant line in sections and is designed to transfer the absorbed thermal energy to the refrigerant in the refrigerant line, and/or the heat sink also rests against a line carrying the system medium and defining the second flow path, or the line is embodied in sections and is designed to transfer the absorbed thermal energy to the system medium.

\* \* \* \* \*